United States Patent
Kim et al.

(10) Patent No.: US 8,765,579 B2
(45) Date of Patent: Jul. 1, 2014

(54) SEMICONDUCTOR WAFER PROCESSING METHOD

(75) Inventors: Youngsuk Kim, Ota-Ku (JP); Shigenori Harada, Ota-Ku (JP)

(73) Assignee: Disco Corporation, Tokyo (JP)

( * ) Notice: Subject to any disclaimer, the term of this patent is extended or adjusted under 35 U.S.C. 154(b) by 190 days.

(21) Appl. No.: 13/527,850

(22) Filed: Jun. 20, 2012

(65) Prior Publication Data

US 2012/0322231 A1    Dec. 20, 2012

(30) Foreign Application Priority Data

Jun. 20, 2011 (JP) ................ 2011-136072

(51) Int. Cl.
- *H01L 21/58* (2006.01)
- *H01L 21/683* (2006.01)
- *H01L 21/52* (2006.01)
- *H01L 21/56* (2006.01)

(52) U.S. Cl.
CPC ............ *H01L 21/6836* (2013.01); *H01L 21/52* (2013.01); *H01L 21/568* (2013.01)
USPC ............ 438/459; 438/118; 438/456; 438/464

(58) Field of Classification Search
CPC .... H01L 21/6836; H01L 21/52; H01L 21/568
USPC .................. 438/118, 456, 459, 464
See application file for complete search history.

(56) References Cited

U.S. PATENT DOCUMENTS

| 8,629,042 B2 * | 1/2014 | Yang et al. ............ 438/460 |
| 2008/0242052 A1 * | 10/2008 | Feng et al. ............ 438/459 |
| 2010/0267175 A1 * | 10/2010 | Amada et al. ............ 438/17 |

FOREIGN PATENT DOCUMENTS

JP    2001-053218    2/2001    ........... H01L 25/18

* cited by examiner

*Primary Examiner* — Kimberly Rizkallah
*Assistant Examiner* — Maria Ligai
(74) *Attorney, Agent, or Firm* — Greer Burns & Crain, Ltd.

(57) ABSTRACT

A semiconductor wafer has a device area where a plurality of semiconductor devices are respectively formed in a plurality of regions partitioned by a plurality of crossing division lines formed on the front side of the semiconductor wafer and a peripheral area surrounding the device area. The back side of the semiconductor wafer corresponding to the device area is ground to thereby form a circular recess and an annular projection surrounding the circular recess. In a chip stacked wafer forming step, a plurality of semiconductor device chips are provided on the bottom surface of the circular recess of the semiconductor wafer at the positions respectively corresponding to the semiconductor devices of the semiconductor wafer. The chip stacked wafer is ground to reduce the thickness of each semiconductor device chip to a finished thickness, and a through electrode is formed in each semiconductor device of the semiconductor wafer.

2 Claims, 12 Drawing Sheets

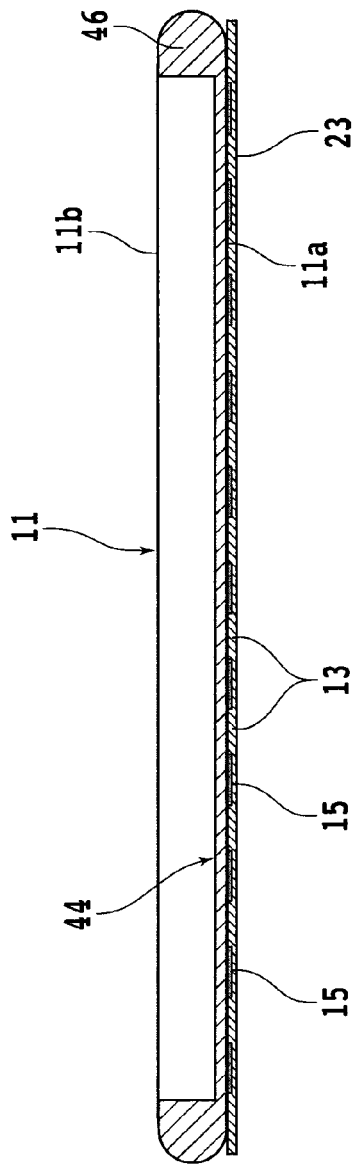
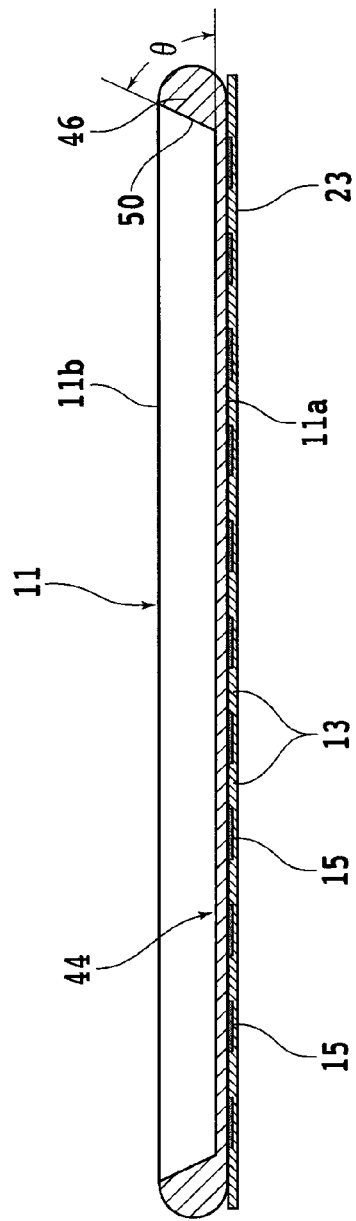

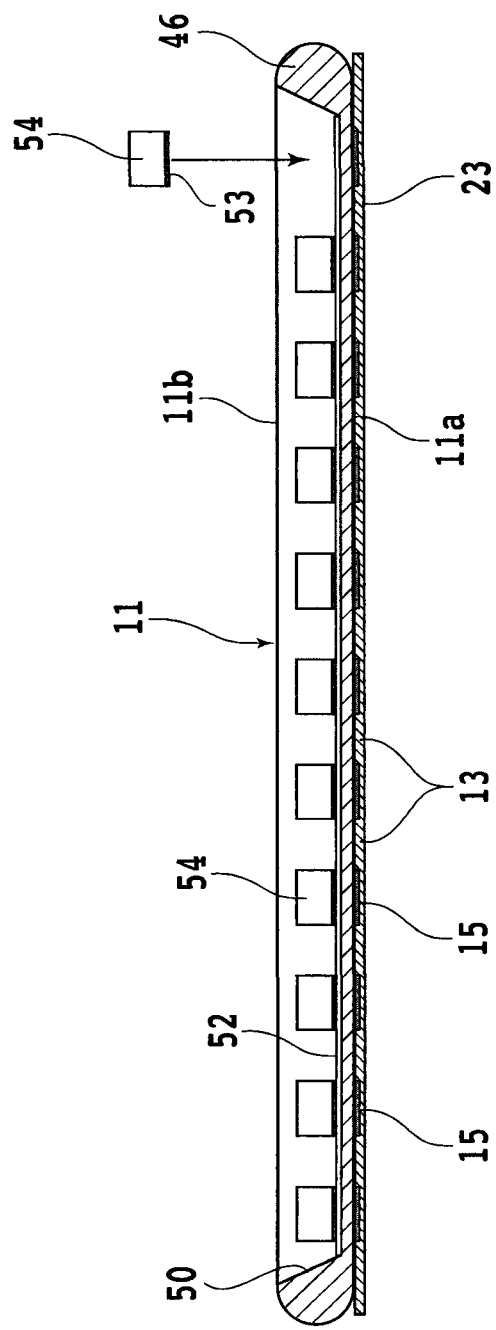

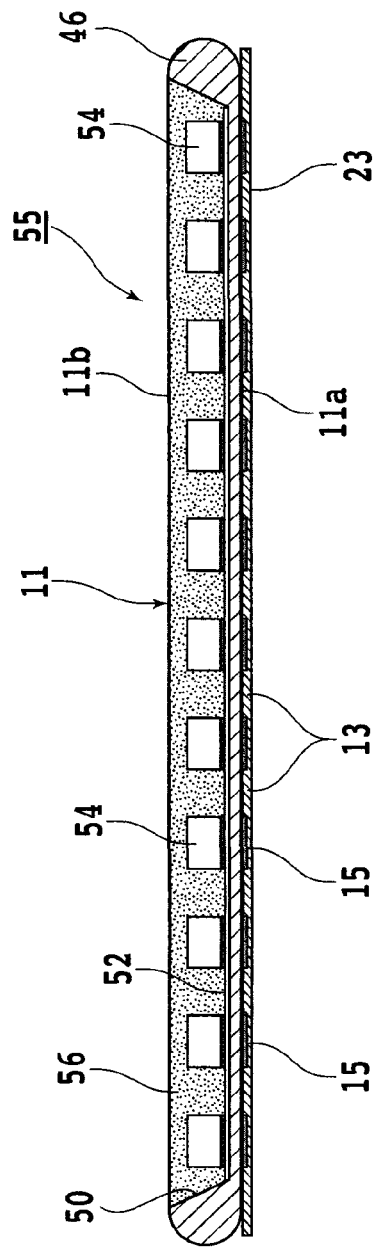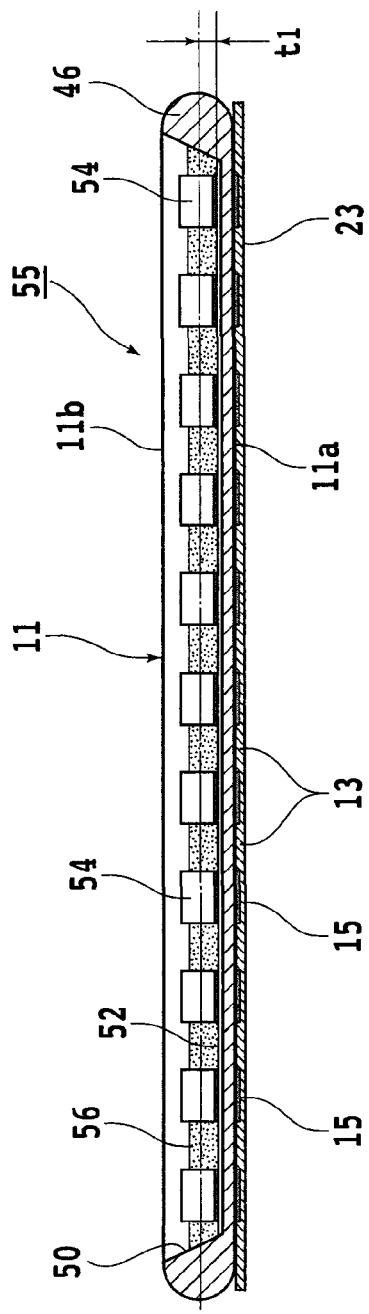

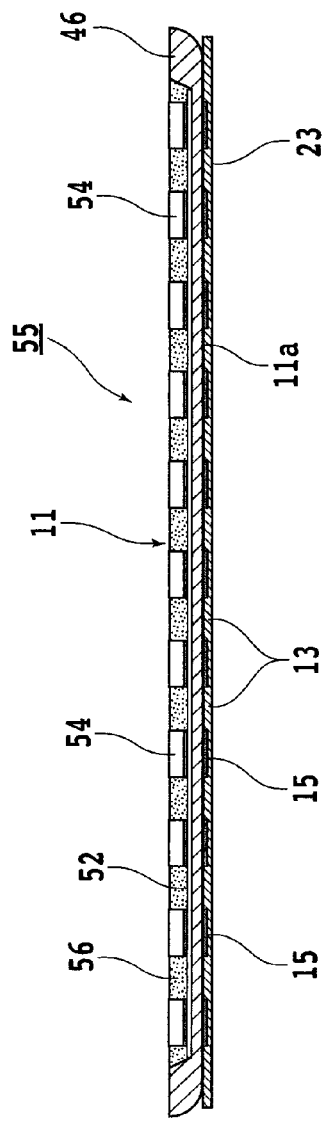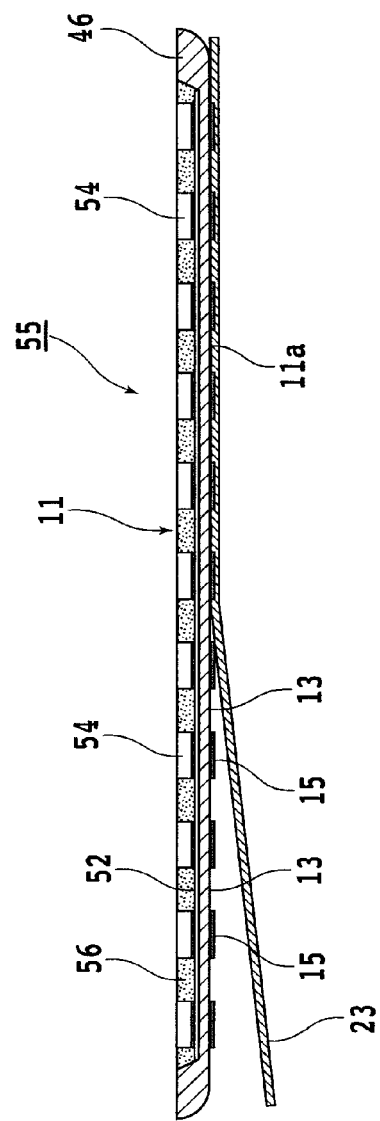

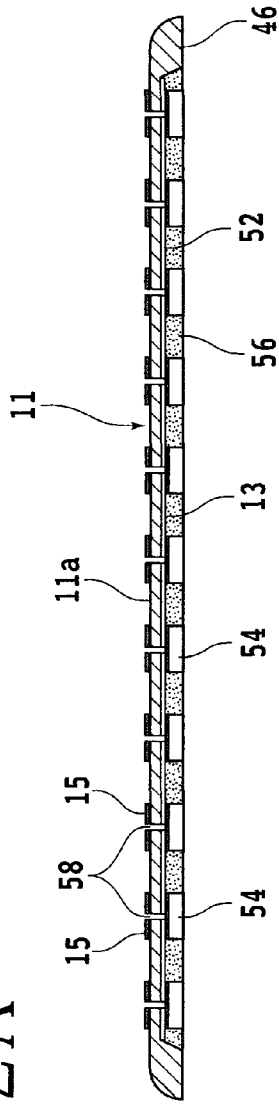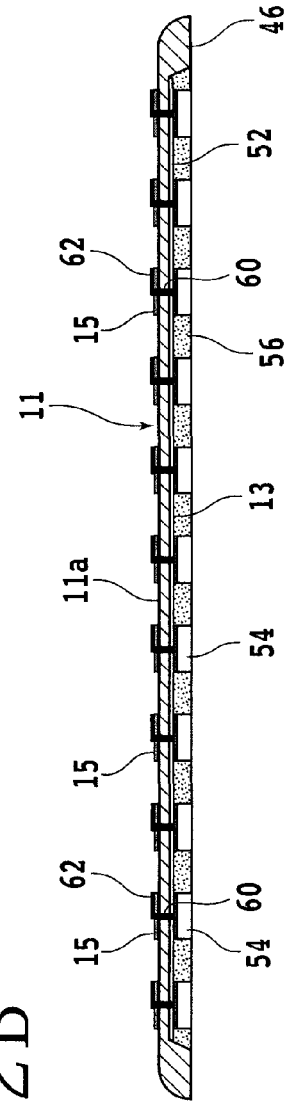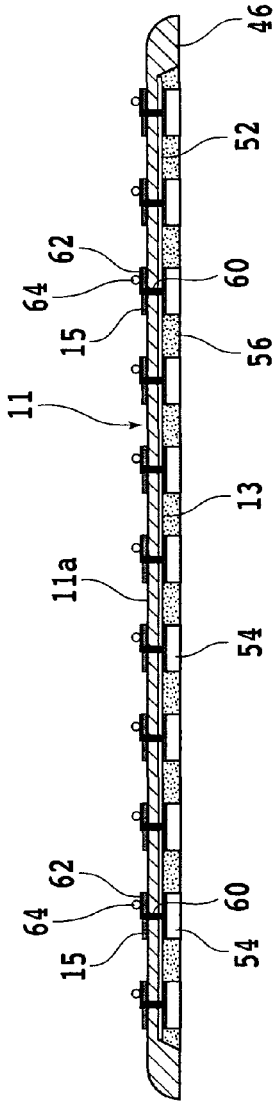

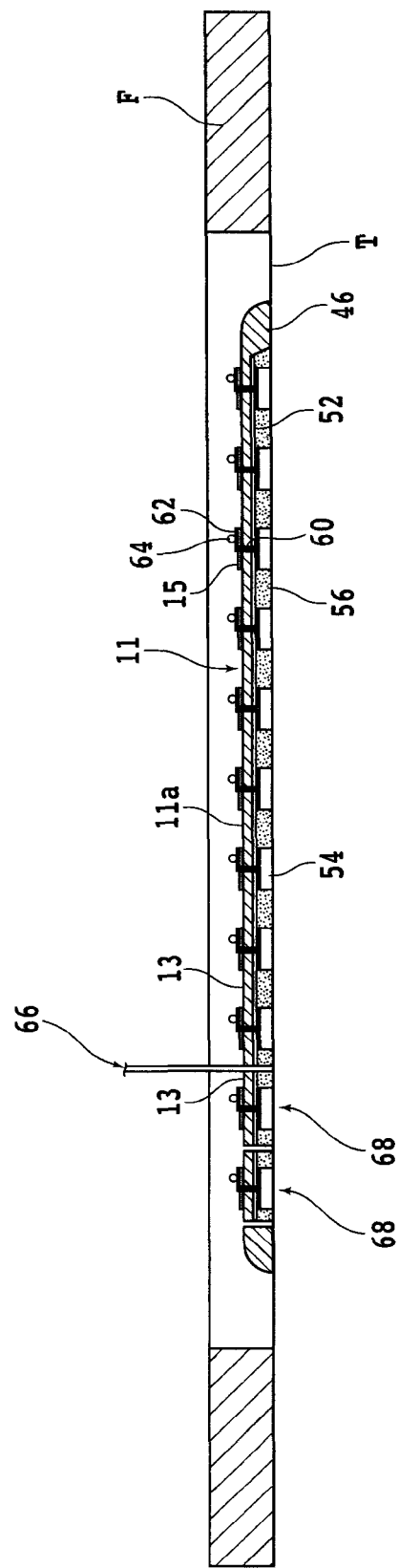

SEMICONDUCTOR WAFER PROCESSING METHOD

BACKGROUND OF THE INVENTION

1. Field of the Invention

The present invention relates to a semiconductor wafer processing method for manufacturing a stacked device chip composed of a plurality of stacked semiconductor devices.

2. Description of the Related Art

In a semiconductor device fabrication process, a plurality of crossing division lines called streets are formed on the front side of a semiconductor wafer to thereby partition a plurality of regions where devices such as ICs and LSIs are respectively formed. The semiconductor wafer is divided into chips along the division lines, thereby manufacturing a plurality of individual semiconductor devices. The semiconductor devices thus manufactured are widely used in various electrical equipment.

With a reduction in size and thickness of electrical equipment in recent years, it is required to also reduce the size and thickness of a semiconductor device package, and high-density mounting is therefore required. As a technique for integrating a plurality of semiconductor devices in one package, there is a three-dimensional mounting technique such that a plurality of semiconductor device chips are stacked in a vertical direction. In a conventional three-dimensional mounting technique, the semiconductor device chips are connected to each other by wire bonding or the semiconductor device chips and an interposer are connected to each other by wire bonding. The connection by wire bonding has a problem such that an inductance is increased by the length of wires and this technique is therefore unsuitable for high-speed transmission of signals. Another problem on wire bonding is such that the semiconductor device chips must be stacked without the contact of the wires, causing the difficulty in reducing the size of the package.

As a new three-dimensional mounting technique, there has recently been developed a stacking technique such that a plurality of semiconductor device chips are stacked on a semiconductor device wafer (Chip On Wafer) and a through electrode extending between a semiconductor device of each semiconductor device chip and each semiconductor device of the semiconductor device wafer is formed to connect these semiconductor devices to each other. To reduce the thickness of such a stacked chip package, it is desirable to reduce the thickness of each semiconductor device chip to be stacked on the semiconductor device wafer to 50 μm or less, for example. For the purposes of facilitating the handling of the semiconductor device wafer and reducing the risk of damage to the semiconductor device wafer, the semiconductor device wafer is attached to a substrate before reducing the thickness of the semiconductor device wafer and performing various processings.

In forming the through electrode, it is necessary to perform heat treatment such as an insulating film forming step including heating at about 450° C. and a reflow step including heating at about 200° C. Conventionally, after the semiconductor device wafer is attached to the substrate such as a glass substrate by using a heat-resistant adhesive, the semiconductor device wafer is subjected to a metal film forming step and heat treatment.

SUMMARY OF THE INVENTION

In general, there is a problem such that the heat-resistant adhesive is expensive. Further, when the semiconductor device wafer is attached through the adhesive to the substrate, the adhesive may remain on the device surface of the semiconductor device wafer after performing the heat treatment. Further, the substrate is required to have high flatness, so that it is very expensive. Accordingly, a process without using such a substrate is desired.

Each semiconductor device chip to be stacked in forming the stacked device package is required to have a thickness of 50 μm or less, for example. However, such a thin semiconductor device chip is difficult to handle, and there is accordingly a possibility of damage to the chip in stacking.

It is therefore an object of the present invention to provide a semiconductor wafer processing method which can form a chip stacked wafer having semiconductor devices and semiconductor device chips respectively stacked on the semiconductor devices without using a substrate and without causing damage to the semiconductor device chips.

In accordance with an aspect of the present invention, there is provided a processing method for a semiconductor wafer having a device area where a plurality of semiconductor devices are respectively formed in a plurality of regions partitioned by a plurality of crossing division lines formed on the front side of the semiconductor wafer and a peripheral marginal area surrounding the device area, the processing method including a protective tape attaching step of attaching a protective tape to the front side of the semiconductor wafer; a grinding step of grinding the back side of the semiconductor wafer in a central area corresponding to the device area to thereby form a circular recess and an annular projection surrounding the circular recess after performing the protective tape attaching step; a chip stacked wafer forming step of providing a plurality of semiconductor device chips on the bottom surface of the circular recess of the semiconductor wafer at the positions respectively corresponding to the semiconductor devices of the semiconductor wafer in the condition where the device surface of each semiconductor device chip comes into contact with the bottom surface of the circular recess and filling a filler into the circular recess until reaching a depth corresponding to a finished thickness of each semiconductor device chip to thereby form a chip stacked wafer after performing the grinding step; a thickness reducing step of grinding the back side of the chip stacked wafer to thereby reduce the thickness of each semiconductor device chip to the finished thickness after performing the chip stacked wafer forming step; and a through electrode forming step of forming a through electrode in each semiconductor device of the semiconductor wafer after performing the thickness reducing step.

Preferably, the processing method further includes a dividing step of dividing the chip stacked wafer along the division lines after performing the through electrode forming step.

According to the present invention, the annular projection as a reinforcing portion is formed along the outer circumference of the semiconductor wafer by the grinding step. Accordingly, the chip stacked wafer having the semiconductor device chips respectively stacked on the semiconductor devices can be formed without using a substrate. After the semiconductor device chips in their unground condition (thick condition) are respectively stacked on the semiconductor devices, the back side of each semiconductor device chip is ground. Accordingly, handling of each semiconductor device chip in stacking can be made easy to thereby reduce the risk of damage to each semiconductor device chip.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 7A is a sectional view of the semiconductor wafer processed by performing a first preferred embodiment of the grinding step;

FIG. 7B is a sectional view of the semiconductor wafer processed by performing a second preferred embodiment of the grinding step;

FIG. 8 is a sectional view showing a manner of mounting a plurality of semiconductor device chips respectively on the semiconductor devices of the semiconductor wafer;

FIG. 9A is a sectional view showing a condition where a circular recess formed on the back side of the semiconductor wafer is fully filled with a filler so that the semiconductor device chips are embedded in the filler;

FIG. 9B is a sectional view showing a condition where the filler is filled into the circular recess until reaching a depth corresponding to a finished thickness of each semiconductor device chip;

FIG. 10 is a sectional view of a chip stacked wafer processed by performing a thickness reducing step;

FIG. 11 is a sectional view of the chip stacked wafer, showing a protective tape removing step;

FIG. 12A is a sectional view showing a condition where a through hole is formed in each semiconductor device of the chip stacked wafer;

FIG. 12B is a sectional view showing a condition where a through electrode and a rewiring layer are formed for each semiconductor device of the chip stacked wafer;

FIG. 12C is a sectional view showing a condition where a bump is formed for each semiconductor device of the chip stacked wafer; and FIG. 13 is a sectional view showing a dividing step of dividing the chip stacked wafer into individual stacked device chips by using a cutting blade.

DETAILED DESCRIPTION OF THE PREFERRED EMBODIMENTS

Figure 1:
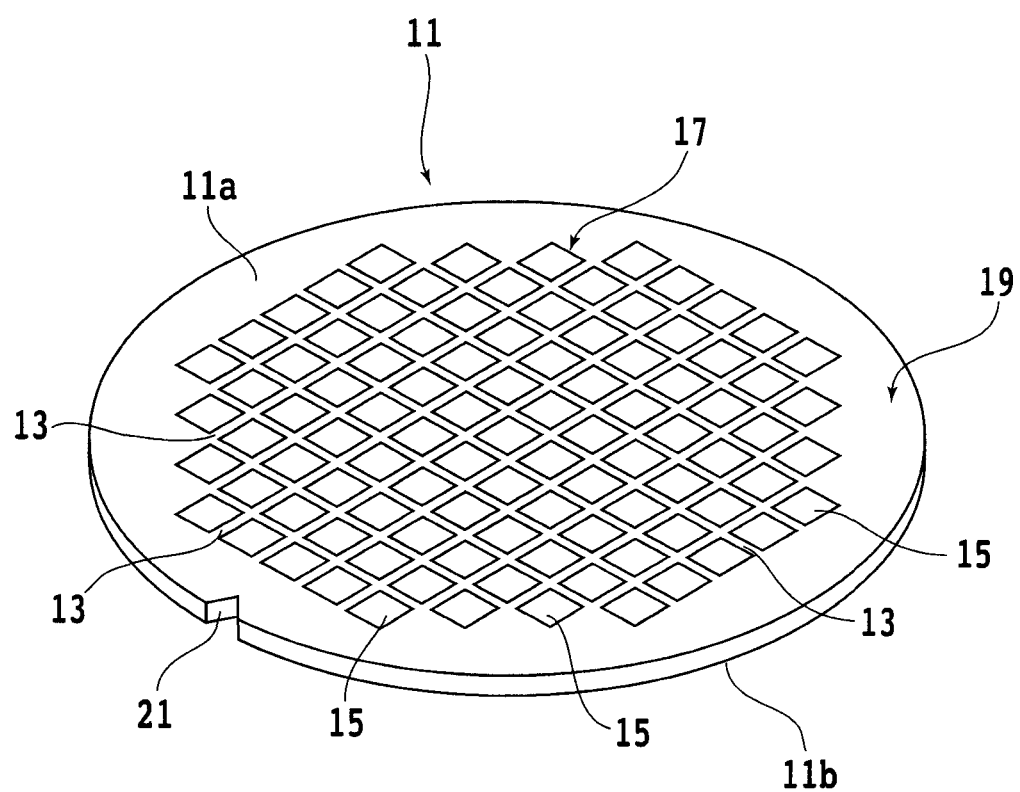
FIG. 1 is a perspective view of a semiconductor wafer, showing the front side of the semiconductor wafer.

A semiconductor wafer processing method according to a preferred embodiment of the present invention will now be described in detail with reference to the drawings. FIG. 1 is a perspective view of a semiconductor wafer (semiconductor device wafer) to be processed by the semiconductor wafer processing method according to the present invention. The semiconductor wafer 11 shown in FIG. 1 is formed from a silicon wafer having a thickness of 700 μm, for example. A plurality of crossing streets (division lines) 13 are formed on the front side 11a of the semiconductor wafer 11, thereby partitioning a plurality of rectangular regions where a plurality of semiconductor devices 15 such as ICs and LSIs are respectively formed. The front side 11a of the semiconductor wafer 11 includes a device area 17 where the semiconductor devices 15 are formed and a peripheral marginal area 19 surrounding the device area 17. The outer circumference of the semiconductor wafer 11 is formed with a notch 21 as a mark for indicating the crystal orientation of the silicon wafer.

Figure 2:
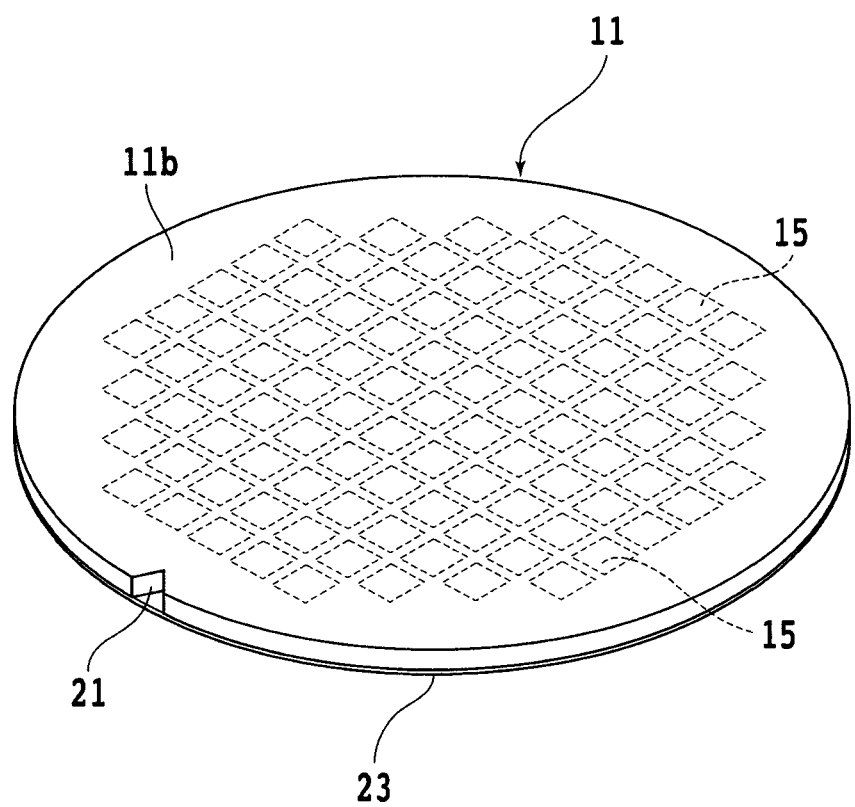
FIG. 2 is a perspective view of the semiconductor wafer, showing the back side of the semiconductor wafer in the condition where a protective tape is attached to the front side of the semiconductor wafer.
Figure 3:
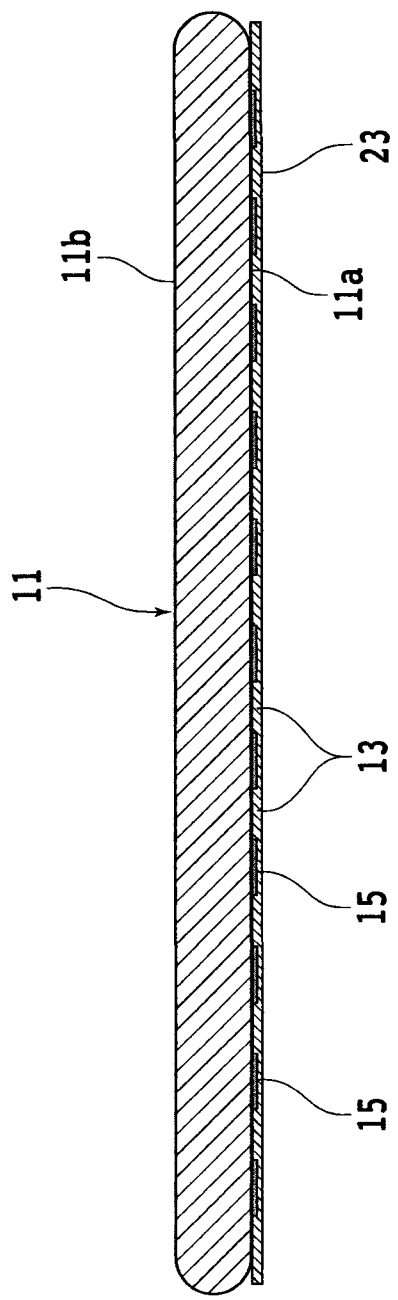
FIG. 3 is a sectional view of the semiconductor wafer in the condition shown in FIG. 2.

As shown in FIG. 2, a protective tape 23 is attached to the front side 11a of the semiconductor wafer 11 by performing a protective tape attaching step. Accordingly, the front side 11a of the semiconductor wafer 11 is protected by the protective tape 23, and the back side 11b of the semiconductor wafer 11 is exposed as shown in FIG. 2. FIG. 3 is a sectional view of the semiconductor wafer 11 in the condition where the protective tape 23 is attached to the front side 11a of the semiconductor wafer 11.

Figure 4:
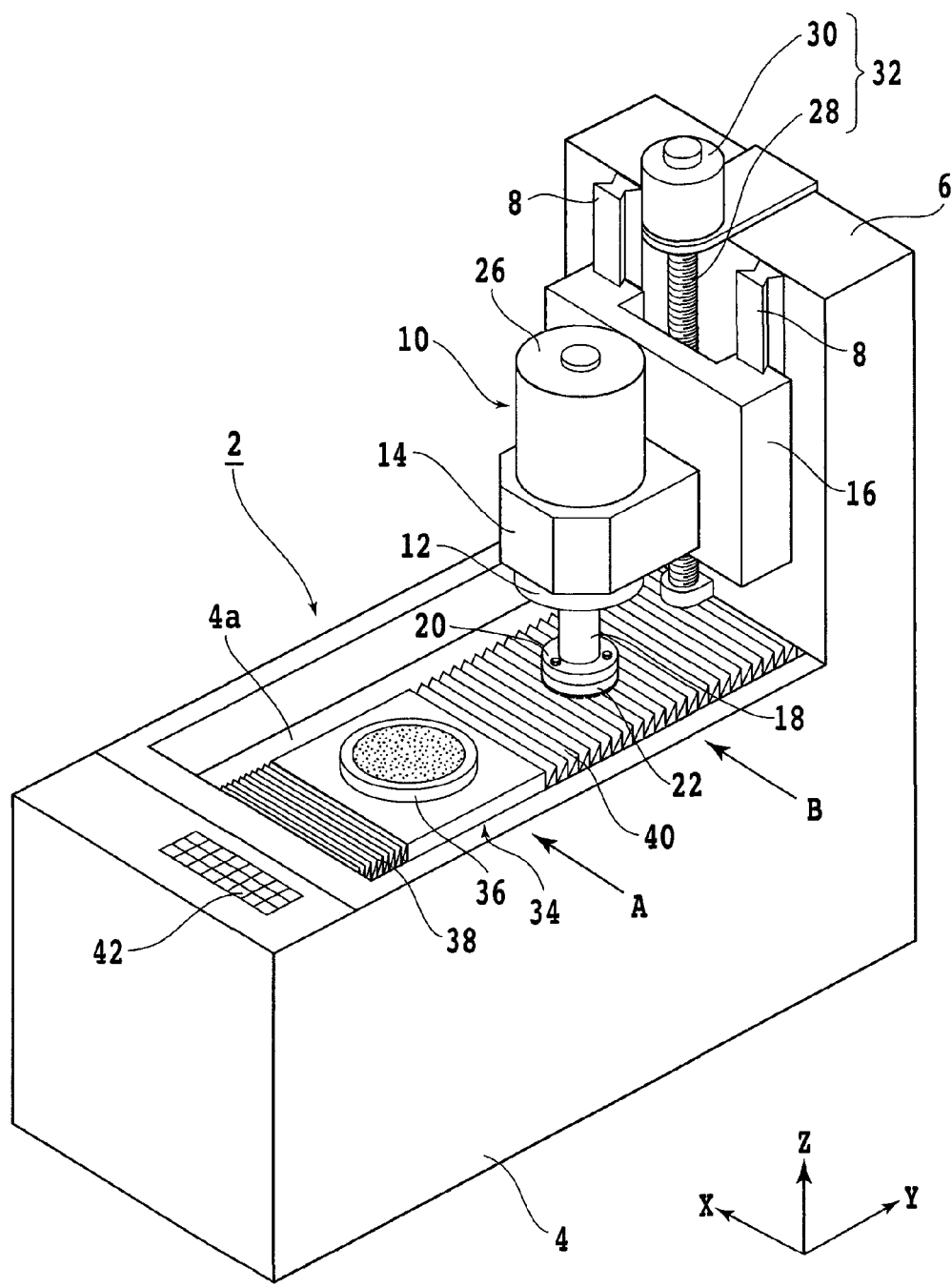
FIG. 4 is a perspective view of a grinding apparatus suitable for use in performing the semiconductor wafer processing method of the present invention.

FIG. 4 is a perspective view of a grinding apparatus 2 suitable for use in performing the semiconductor wafer processing method according to the present invention. The grinding apparatus 2 shown in FIG. 4 includes a base (housing) 4 having a column 6 vertically extending at the rear end. A pair of vertically extending guide rails 8 are fixed to the front surface of the column 6. A grinding unit (grinding means) 10 is mounted on the column 6 so as to be vertically movable along the guide rails 8. The grinding unit 10 includes a housing 12 and a support member 14 for supporting the housing 12. The support member 14 is mounted on a moving base 16 vertically movable along the guide rails 8.

The grinding unit 10 includes a spindle 18 rotatably accommodated in the housing 12, a mounter 20 fixed to the lower end of the spindle 18, a grinding wheel 22 mounted on the lower surface of the mounter 20 by screws, the grinding wheel 22 having a plurality of abrasive members 24 (see FIG. 5) annularly arranged, and a servo motor 26 for rotating the spindle 18. The grinding apparatus 2 further includes a grinding unit feeding mechanism 32 for vertically moving the grinding unit 10 along the guide rails 8. The grinding unit feeding mechanism 32 is composed of a ball screw 28 threadedly engaged with the moving base 16 for vertically moving the moving base 16 along the guide rails 8 and a pulse motor 30 for rotating the ball screw 28. Accordingly, when the pulse motor 30 is driven, the ball screw 28 is rotated to thereby vertically move the moving base 16.

The upper surface of the base 4 is formed with a recess 4a, and a chuck table mechanism 34 is provided in the recess 4a. The chuck table mechanism 34 has a chuck table 36. The chuck table 36 is movable in the Y direction by a chuck table moving mechanism (not shown) to selectively take a loading/unloading position A set on the front side of the grinding unit 10 as shown in FIG. 4 and a grinding position B opposed to the grinding unit 10 on the lower side thereof. A pair of bellows 38 and 40 are provided on the front and rear sides of the chuck table 36. Further, an operation panel 42 allowing the input of grinding conditions or the like by an operator of the grinding apparatus 2 is provided on the upper surface of the front end portion of the base 4.

Figure 5:
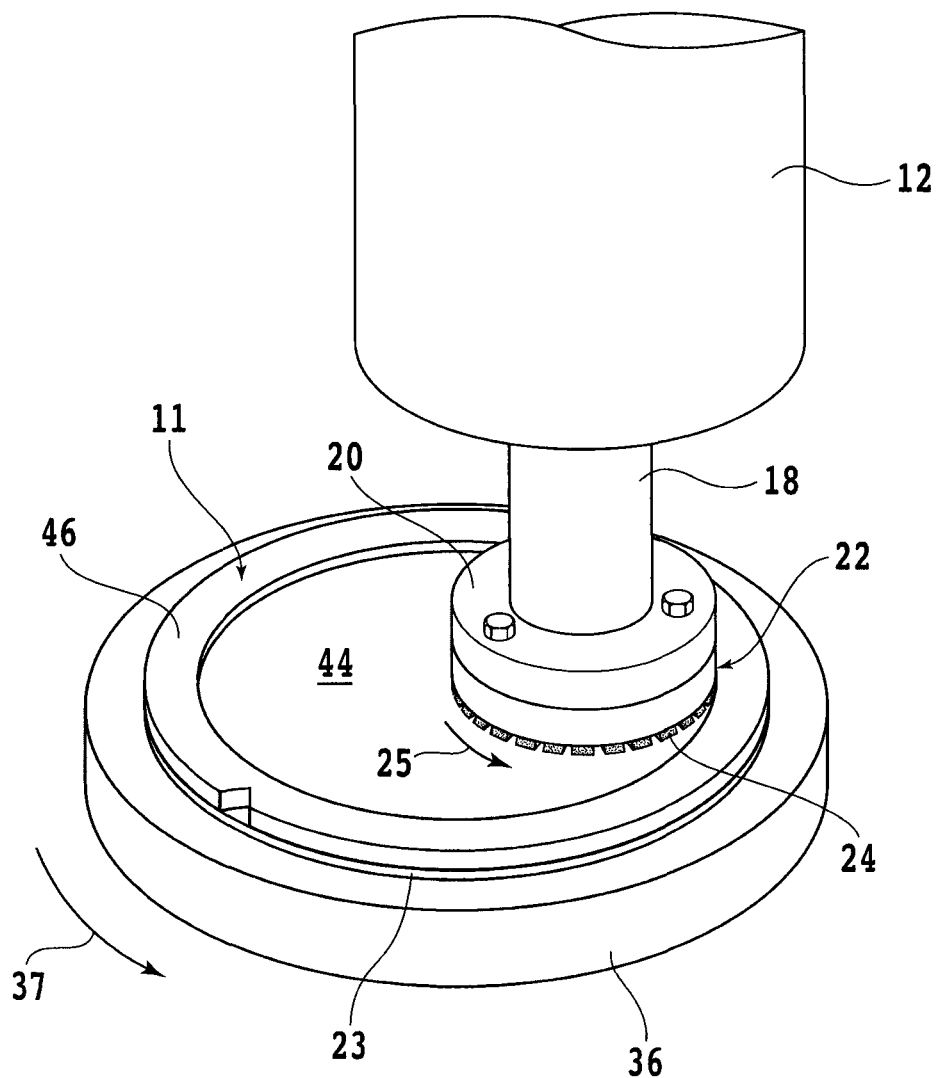
FIG. 5 is a perspective view showing a grinding step being performed by a grinding wheel.

A grinding step using the grinding apparatus 2 shown in FIG. 4 will now be described. As shown in FIG. 5, the semiconductor wafer 11 is held under suction on the chuck table 36 in the condition where the protective tape 23 attached to the front side 11a of the semiconductor wafer 11 is in contact with the upper surface of the chuck table 36. The chuck table 36 thus holding the semiconductor wafer 11 is moved in the Y direction by the chuck table moving mechanism from the loading/unloading position A shown in FIG. 4 to the grinding position B opposed to the grinding unit 10. Then, the grinding step is performed at the grinding position B.

According to a first preferred embodiment of the grinding step, the chuck table 36 is rotated at 300 rpm, for example, in the direction shown by an arrow 37 and the grinding wheel 22 is rotated at 6000 rpm, for example, in the direction shown by an arrow 25 as shown in FIG. 5. At the same time, the grinding unit feeding mechanism 32 is operated to bring the abrasive members 24 of the grinding wheel 22 into contact with the back side 11b of the semiconductor wafer 11. Further, the grinding wheel 22 is fed downward by a predetermined amount at a predetermined feed speed. As a result, the back side 11b of the semiconductor wafer 11 is ground at its central area corresponding to the device area 17 to form a circular recess 44 having a predetermined depth and accordingly form an annular projection 46 around the circular recess 44 as shown in FIG. 5. Accordingly, the annular projection 46 is formed as the remaining peripheral portion corresponding to the peripheral marginal area 19. FIG. 7A is a sectional view of the semiconductor wafer 11 in the condition where the circular recess 44 and the annular projection 46 are formed by the first preferred embodiment of the grinding step mentioned above.

Figure 6:
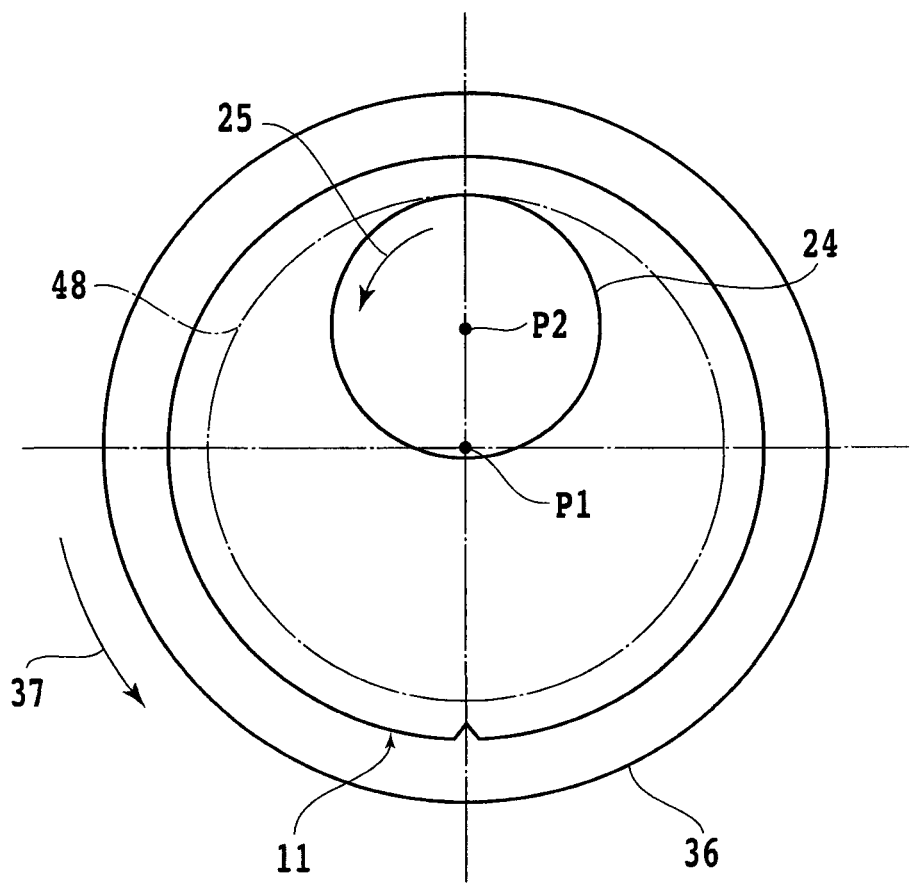
FIG. 6 is a schematic plan view for illustrating the grinding step.

The relation between the semiconductor wafer 11 held on the chuck table 36 and the abrasive members 24 of the grinding wheel 22 in performing the first preferred embodiment of the grinding step will now be described with reference to FIG. 6. The center P1 of rotation of the chuck table 36 (i.e., the center of rotation of the semiconductor wafer 11) and the center P2 of rotation of the ring of the abrasive members 24 annularly arranged (i.e., the center of rotation of the grinding wheel 22) are deviated from each other as shown in FIG. 6. Further, the outer diameter of the ring of the abrasive members 24 is set smaller than the diameter of a boundary circle 48 between the device area 17 and the peripheral marginal area 19 of the semiconductor wafer 11. Further, the outer diameter of the ring of the abrasive members 24 is set slightly larger than the radius of the boundary circle 48. Accordingly, the outer circumference of the ring of the abrasive members 24 comes into contact with the boundary circle 48, and the ring of the abrasive members 24 passes through the center P1 of rotation of the chuck table 36.

In the first preferred embodiment of the grinding step described above, the grinding unit 20 is vertically fed by the grinding unit feeding mechanism 32 after stopping the movement of the chuck table 36 in the Y direction, thereby forming the circular recess 44. According to this grinding step, the inner circumferential wall of the annular projection 46 becomes vertical (perpendicular to the bottom surface of the circular recess 44).

According to a second preferred embodiment of the grinding step, the grinding unit 20 is vertically fed by the grinding unit feeding mechanism 32 while slightly moving the chuck table 36 in the Y direction, thereby grinding the back side 11b of the semiconductor wafer 11. FIG. 7B is a sectional view of the semiconductor wafer 11 in the condition where the back side 11b of the semiconductor wafer 11 is ground by the second preferred embodiment of the grinding step to form an inclined surface 50 as the inner circumferential wall of the annular projection 46.

The second preferred embodiment of the grinding step thus forming the inclined inner circumferential wall 50 of the annular projection 46 has a merit such that when a liquid adhesive is applied to the circular recess 44 by spin coating in the subsequent step, a residual part of the liquid adhesive can be easily removed from the circular recess 44. The angle θ of the inclined inner circumferential wall 50 shown in FIG. 7B may be suitably set according to various conditions including the viscosity of the adhesive, the conditions for spin coating, the depth of the circular recess, the thickness of the adhesive layer, and the size of each semiconductor chip to be mounted. For example, the angle θ is preferably set to about 10 to 60 degrees.

After performing the grinding step, a chip stacked wafer forming step is performed in the following manner. As a first stage of the chip stacked wafer forming step, an adhesive 52 is applied to the bottom surface of the circular recess 44 as shown in FIG. 8. As a method of applying the adhesive 52, spin coating of a liquid adhesive is preferably adopted. According to the spin coating, a residual part of the liquid adhesive can be easily removed from the circular recess 44 through the inclined inner circumferential wall 50 of the annular projection 46. As a modification, a sheet adhesive may be used in place of the liquid adhesive.

Thereafter, a plurality of semiconductor device chips 54 each having a device 53 are bonded through the adhesive 52 to the bottom surface of the circular recess 44 at the positions respectively corresponding to the devices 15 of the semiconductor wafer 11 in the condition where each device 53 of the semiconductor device chip 54 is oriented downward as shown in FIG. 8. As a modification, an adhesive may be applied to each device 53 of the semiconductor device chips 54 rather than applying the adhesive 52 to the bottom surface of the circular recess 44, thereby bonding the semiconductor device chips 54 to the bottom surface of the circular recess 44 at the positions respectively corresponding to the devices 15 of the semiconductor wafer 11.

As a second stage of the chip stacked wafer forming step, a filler 56 such as epoxy resin is filled into the circular recess 44 of the semiconductor wafer 11 so that the semiconductor device chips 54 are embedded in the filler 56, thereby forming a chip stacked wafer 55 as shown in FIG. 9A. It is not necessary to completely embed the semiconductor device chips 54 in the filler 56, but it is essential to fill the filler 56 into the circular recess 44 until reaching a depth corresponding to a finished thickness t1 of each semiconductor device chip 54 whose back side is to be ground later as shown in FIG. 9B.

After performing the chip stacked wafer forming step, a thickness reducing step is performed to grind the back side of the chip stacked wafer 55, thereby reducing the thickness of the chip stacked wafer 55 to a predetermined thickness. This thickness reducing step is performed preferably by using a grinding apparatus, and more preferably by using a grinding wheel having a diameter larger than that of the grinding wheel 22 of the grinding apparatus 2 shown in FIG. 4. FIG. 10 is a sectional view of the chip stacked wafer 55 in the condition after performing the thickness reducing step. By performing this thickness reducing step, the thickness of each semiconductor device chip 54 is reduced to the finished thickness t1.

After performing the thickness reducing step, the protective tape 23 is peeled off from the front side of the chip stacked wafer 55 as shown in FIG. 11. Thereafter, a through electrode forming step is performed in the following manner. First, a resist is applied to the front side 11a of the semiconductor wafer 11 (i.e., the front side of the chip stacked wafer 55) by spin coating or the like. Thereafter, the resist applied is patterned to form a through electrode forming mask. Thereafter, dry etching is performed to the semiconductor wafer 11 by using this through electrode forming mask. As a result, a plurality of through holes 58 are formed so as to respectively extend through the semiconductor devices 15 formed on the front side 11a of the semiconductor wafer 11 as shown in FIG. 12A. Each through hole 58 has a depth reaching the semiconductor device 53 of each semiconductor device chip 54 mounted on the back side 11b of the semiconductor wafer 11.

As a modification, the through holes 58 extending through the respective semiconductor devices 15 may be formed by the application of a laser beam rather than by dry etching. After forming the through holes 58, an insulating film and a barrier metal (both not shown) are formed in each through hole 58. Thereafter, the resist is removed and each through hole 58 is filled with copper. Thereafter, the copper is polished by chemical mechanical polishing (CMP) to planarize the front side 11a of the semiconductor wafer 11, thereby forming a plurality of through electrode 60 respectively connecting the semiconductor devices 53 of the semiconductor device chips 54 and the semiconductor devices 15 of the semiconductor wafer 11 as shown in FIG. 12B. Further, a rewiring layer 62 is formed on each semiconductor device 15 by a photolithography process as shown in FIG. 12B. Finally, a bump 64 is formed on a pad of the rewiring layer 62 as shown in FIG. 12C.

After performing the through electrode forming step, the chip stacked wafer 55 is attached to a dicing tape T supported at its outer circumferential portion to an annular frame F as shown in FIG. 13. Thereafter, the chip stacked wafer 55 is cut along each street 13 by a cutting blade 66 of a cutting apparatus, thereby dividing the chip stacked wafer 55 into a plurality of individual stacked device chips 68 as shown in FIG. 13. As a modification, the chip stacked wafer 55 may be divided into the individual stacked device chips 68 by the application of a laser beam rather than by dicing using the cutting blade 66.

While each stacked device chip 68 is formed by stacking two chips in this preferred embodiment, each stacked device chip may be formed by stacking three or more chips. In this case, the stacked device chips obtained by dividing the chip stacked wafer 55 having the through electrodes 60 and the rewiring layers 62 as shown in FIG. 12B along the streets 13 are respectively stacked on the semiconductor devices 15 of the semiconductor wafer 11 shown in FIG. 8 to thereby form a chip stacked wafer having three layers of chips.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method for a semiconductor wafer having a device area where a plurality of semiconductor devices are respectively formed in a plurality of regions partitioned by a plurality of crossing division lines formed on a front side of said semiconductor wafer and a peripheral marginal area surrounding said device area, said processing method comprising:
   a protective tape attaching step of attaching a protective tape to the front side of said semiconductor wafer;
   a grinding step of grinding the back side of said semiconductor wafer in a central area corresponding to said device area to thereby form a circular recess and an annular projection surrounding said circular recess after performing said protective tape attaching step;
   a chip stacked wafer forming step of providing a plurality of semiconductor device chips on a bottom surface of said circular recess of said semiconductor wafer at the positions respectively corresponding to said semiconductor devices of said semiconductor wafer in a condition where the device surface of each semiconductor device chip comes into contact with the bottom surface of said circular recess and filling a filler into said circular recess until reaching a depth corresponding to a finished thickness of each semiconductor device chip to thereby form a chip stacked wafer after performing said grinding step;
   a thickness reducing step of grinding the back side of said chip stacked wafer to thereby reduce the thickness of each semiconductor device chip to said finished thickness after performing said chip stacked wafer forming step; and
   a through electrode forming step of forming a through electrode in each semiconductor device of said semiconductor wafer after performing said thickness reducing step.

2. The processing method for a semiconductor wafer according to claim 1, further comprising
   a dividing step of dividing said chip stacked wafer along said division lines after performing said through electrode forming step.

* * * * *